(12) United States Patent
Horikoshi et al.

(10) Patent No.: US 8,649,130 B2
(45) Date of Patent: Feb. 11, 2014

(54) MOTOR DRIVING APPARATUS HAVING FAULT DIAGNOSTIC FUNCTION

(75) Inventors: Shinichi Horikoshi, Yamanashi (JP);
Takashi Harada, Yamanashi (JP);
Masatomo Shirouzu, Yamanashi (JP);
Yasusuke Iwashita, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 294 days.

(21) Appl. No.: 13/025,210

(22) Filed: Feb. 11, 2011

(65) Prior Publication Data

US 2011/0241590 A1   Oct. 6, 2011

(30) Foreign Application Priority Data

Mar. 31, 2010   (JP) .................................. 2010-083257

(51) Int. Cl.
*H02H 3/00* (2006.01)
*H02H 7/08* (2006.01)
*G01R 31/02* (2006.01)
*G01R 31/34* (2006.01)

(52) U.S. Cl.
USPC ................. 361/23; 361/31; 361/42; 318/490; 318/400.21; 318/400.22

(58) Field of Classification Search
USPC ........... 361/23, 31, 42, 44, 45, 48, 50, 58, 62, 361/64, 66, 93.1; 318/490, 400.21, 400.22
See application file for complete search history.

(56) References Cited

U.S. PATENT DOCUMENTS

| | | | | |
|---|---|---|---|---|
| 4,380,785 A * | 4/1983 | Demeyer et al. | ................. | 361/96 |
| 5,375,028 A | 12/1994 | Fukunaga | | |
| 5,896,257 A * | 4/1999 | Takahashi | ........................ | 361/31 |
| 6,320,731 B1 * | 11/2001 | Eaves et al. | ...................... | 361/42 |
| 7,016,171 B2 * | 3/2006 | Bax et al. | ........................ | 361/42 |
| 7,733,616 B2 * | 6/2010 | Yamada | ........................... | 361/31 |
| 2003/0030954 A1 * | 2/2003 | Bax et al. | ........................ | 361/87 |
| 2009/0009920 A1 * | 1/2009 | Yamada | ........................ | 361/93.1 |
| 2009/0086396 A1 * | 4/2009 | Bax et al. | ..................... | 361/93.6 |

FOREIGN PATENT DOCUMENTS

| | | |
|---|---|---|
| DE | 4242560 A1 | 7/1993 |
| JP | 6385380 | 4/1988 |
| JP | 410536 | 1/1992 |
| JP | 05168290 A * | 7/1993 |
| JP | 06233450 A * | 8/1994 |
| JP | 7239359 | 9/1995 |
| JP | 0003108964 B | 9/2000 |
| JP | 2004056889 A | 2/2004 |
| JP | 2004072997 A | 3/2004 |
| JP | 2006020483 A | 1/2006 |
| JP | 2006230194 A * | 8/2006 |

OTHER PUBLICATIONS

Chinese Office Action issued in 2011100474038 dated Apr. 19, 2013.

* cited by examiner

*Primary Examiner* — Eduardo Colon Santana
(74) *Attorney, Agent, or Firm* — Lowe Hauptman & Ham LLP (57) ABSTRACT

A motor driving apparatus capable of detecting during operation a ground fault and a phase-to-phase short circuit by distinguishing one from the other is provided while minimizing an increase in cost. The sum of three-phase AC currents supplied from a three-phase AC power supply to an AC/DC converter is detected by a current sensor. When overcurrent is detected by an overcurrent detector, if the sum of the currents detected by the current sensor is zero, it is determined that the fault is a phase-to-phase short circuit, but if the sum is not zero, it is determined that the fault is a ground fault.

7 Claims, 7 Drawing Sheets

Fig. 9

MOTOR DRIVING APPARATUS HAVING FAULT DIAGNOSTIC FUNCTION

RELATED APPLICATIONS

The present application is based on, and claims priority from, Japanese Application Number 2010-083257, filed Mar. 31, 2010, the disclosure of which is hereby incorporated by reference herein in its entirety.

BACKGROUND OF THE INVENTION

1. Field of the Invention

The present invention relates to a motor driving apparatus having a fault diagnostic function.

2. Description of the Related Art

Providing a motor driving apparatus, which is connected to a three-phase AC power supply and which comprises an AC/DC converter for converting three-phase AC power supplied from the three-phase AC power supply into DC power and a DC/AC converter for converting the DC power output from the AC/DC converter into three-phase AC power for supply to a motor, is known. In such a motor driving apparatus, if three current sensors are provided that detect the three-phase output currents independently of each other, the apparatus can reliably detect any overcurrent occurring in the DC/AC converter and can also identify whether the cause is a ground fault or a phase-to-phase short circuit. That is, if overcurrent occurs in the DC/AC converter because of a ground fault or a phase-to-phase short circuit, the overcurrent can be detected by one of the three sensors, and if the sum of the currents detected by the three current sensors is not zero, it is determined that the cause is a ground fault, but if the sum is zero, it is determined that the cause is a phase-to-phase short circuit.

However, generally only two sensors are provided in order to reduce the cost, and the remaining one of the three phase currents is obtained through calculation by assuming that the sum of the three phase currents is zero. As a result, in the case of a conventional DC/AC converter having two output current sensors, there are cases where overcurrent caused by a ground fault cannot be detected, as will be described in detail later, and if the overcurrent can be detected, it is not possible to identify whether the cause is a ground fault or a phase-to-phase short circuit.

Accordingly, in the case of such a DC/AC converter having two output current sensors, the operation of the apparatus has to be stopped in the event of the occurrence of an overcurrent alarm, and the insulation resistance of the motor and power lines has to be checked in order to determine whether the cause is a ground fault or a phase-to-phase short circuit. Further, if the ground fault is intermittent, it is difficult to identify the cause.

On the other hand, in the case of a motor driving apparatus provided with three output sensors by adding an extra current sensor as earlier described, if the apparatus is one constructed to drive a plurality of motors by supplying the DC power output from the AC/DC converter to a plurality of DC/AC converters, the extra current sensor has to be added to each of the plurality of DC/AC converters, which greatly increases the cost.

JP7-239359A discloses an apparatus that uses one or two current sensors and that provides protection against ground faults by detecting the presence or absences of a ground fault before starting the operation by applying a ground-fault detecting control signal to the AC/DC converter. However, no description is given of how a distinction is made between a ground fault and a phase-to-phase short circuit.

On the other hand, JP4-10536A discloses an apparatus in which a zero phase current detector is provided between the three-phase AC power supply and the apparatus, with provisions made to stop the operation of the inverter apparatus upon detection of a ground fault. However, no description is given of the detection of a phase-to-phase short circuit.

JP63-85380A cited in JP7-239359A discloses a method that provides a detector for detecting the DC current input to the inverter apparatus, wherein the current detection pattern generated when a test control signal was applied to the inverter apparatus before starting the operation is compared with a known pattern to detect the presence or absence of a ground fault or a short circuit fault. However, this method not only has the drawback that the detected current contains a reactive current that flows through free wheel diodes in the inverter apparatus, as described in JP7-239359A (paragraph 0004), but also has the problem that a ground fault or a phase-to-phase short circuit that occurs after starting the operation or a ground fault that occurs intermittently during the operation cannot be detected.

SUMMARY OF THE INVENTION

Accordingly, it is an object of the present invention to achieve, while minimizing an increase in cost, a motor driving apparatus having a fault diagnostic function capable of detecting during operation a ground fault and a phase-to-phase short circuit by distinguishing one from the other.

According to the present invention, there is provided a motor driving apparatus comprising an AC/DC converter for converting three-phase AC power supplied from a three-phase AC power supply into DC power and a DC/AC converter for converting the DC power output from the AC/DC converter into three-phase AC power for supply to a motor, wherein the motor driving apparatus further comprises: a sum current detector which detects the sum of currents flowing from the three-phase AC power supply through the AC/DC converter to the DC/AC converter; an overcurrent detector which detects overcurrent on an output current of the DC/AC converter; and a determining unit which, when overcurrent is detected by the overcurrent detector, determines that a ground fault has occurred if the sum of currents detected by the sum current detector can be judged to be not zero, but determines that a phase-to-phase short circuit has occurred if the sum of currents detected by the sum current detector can be judged to be zero.

By thus detecting the sum of currents, it can be determined whether the cause is a ground fault or a phase-to-phase short circuit, when overcurrent occurs during operation.

Further, in a configuration in which the DC/AC converter includes a plurality of inverters in order to drive a plurality of motors, since the sum current detector and the determining unit added in order to make the determination are provided on the AC/DC converter side, the increase in cost is less than would be if an extra current sensor was added to each inverter in order to make the ground-fault/phase-to-phase short circuit determination.

DESCRIPTION OF THE PREFERRED EMBODIMENTS

Figure 1:
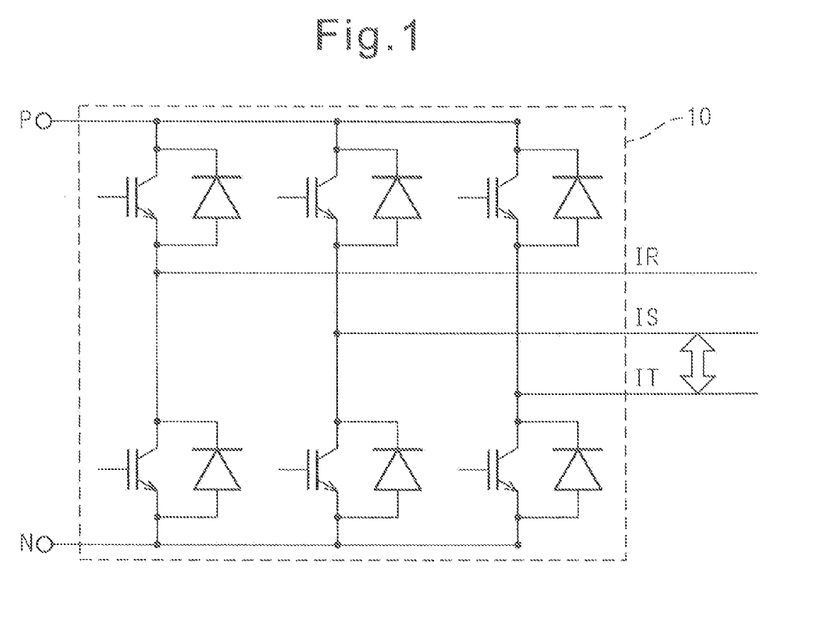
FIG. 1 is a diagram explaining a phase-to-phase short circuit.
Figure 2:
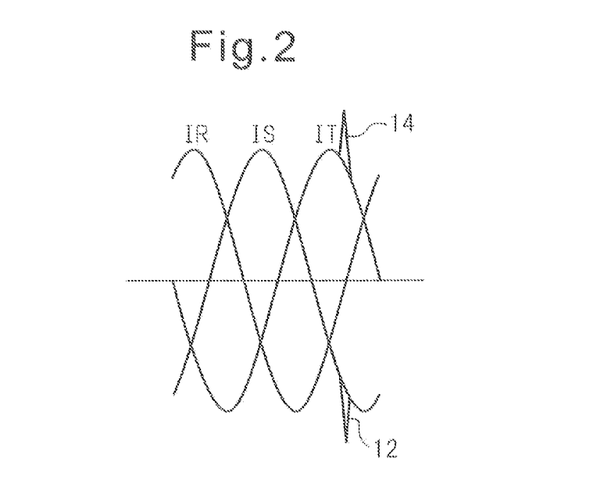
FIG. 2 is a waveform diagram explaining overcurrent occurring due to the phase-to-phase short circuit.

When a short circuit (a phase-to-phase short circuit) momentarily occurs, for example, between the S phase and T phase, at the output side of a DC/AC converter 10, as shown in FIG. 1, overcurrent 12 and overcurrent 14 appear on the S-phase current $I_S$ and T-phase current $I_T$, respectively, as shown in FIG. 2. In the case of a phase-to-phase short circuit, since there is no current return via ground, the following relationship holds between the phase currents $I_R$, $I_S$, and $I_T$.

$$I_R + I_S + I_T = 0 \quad (1)$$

Figure 3:
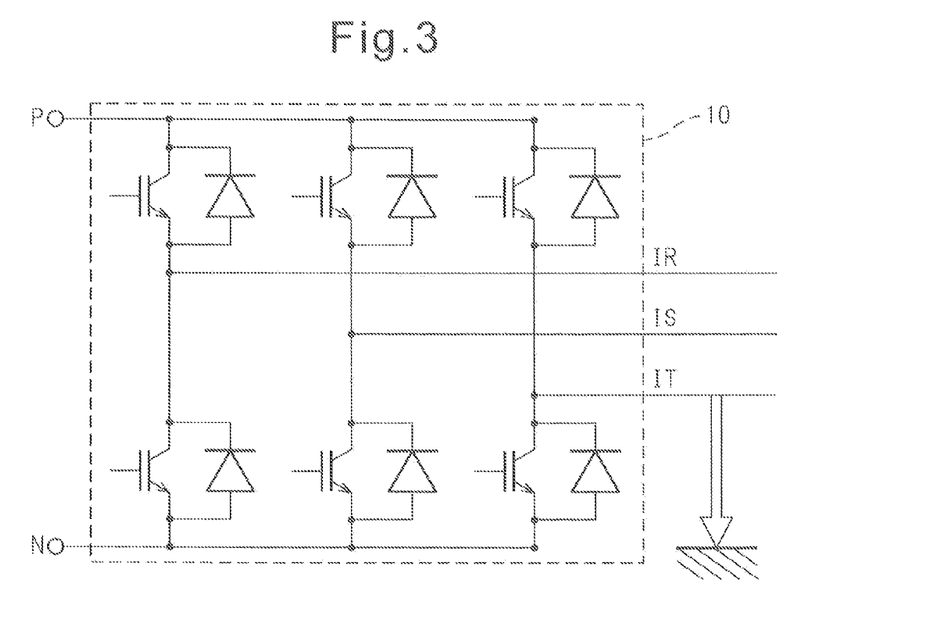
FIG. 3 is a diagram explaining a ground fault.
Figure 4:
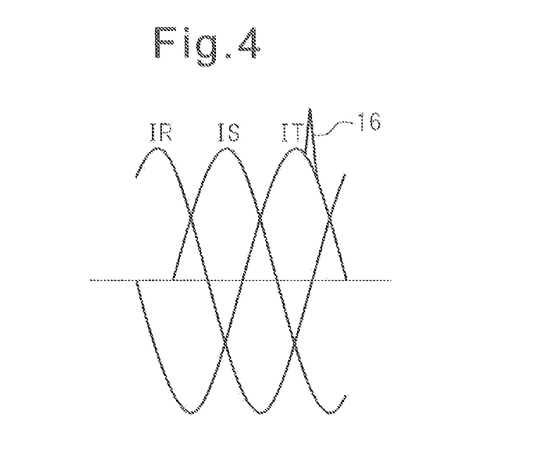
FIG. 4 is a diagram explaining overcurrent occurring due to the ground fault.

On the other hand, when a short circuit to ground (a ground fault) momentarily occurs, for example, in the T phase at the output side of the DC/AC converter 10, as shown in FIG. 3, overcurrent 16 appears on the T-phase current $I_T$, as shown in FIG. 4. In this case, the relation defined by equation (1) does not hold because of the presence of a current return via ground; hence, $$I_R + I_S + I_T \neq 0 \quad (2)$$

If the DC/AC converter 10 is provided at the output side with three current sensors for detecting the three phase currents independently of each other, whether the short circuit is a ground fault or a phase-to-phase short circuit can be determined by taking the sum of the currents and checking whether the relation defined by equation (1) holds or not. However, generally only two sensors are provided in order to reduce the cost, and the remaining one of the three phase currents is obtained through calculation by assuming that the sum of the three phase currents is zero. As a result, using only two current sensors, it is not possible to distinguish between the ground fault and the phase-to-phase short circuit. In the example shown in FIG. 1 (a phase-to-phase short circuit occurs between the S phase and T phase), even when the R phase is not provided with a current sensor, if the S phase and T phase are each provided with a current sensor, the occurrence of the phase-to-phase short circuit can be detected by detecting the overcurrent with the two current sensors. However, in the case where the R phase is provided with a current sensor but one of the S phase and T phase is not provided with a current sensor, it is possible to detect the overcurrent caused by a phase-to-phase short circuit or a ground fault, but it is not possible to determine whether the cause is a phase-to-phase short circuit or a ground fault. Further, in the example shown in FIG. 3 (a short circuit occurs in the T phase), if the T phase is not provided with a current sensor, even the occurrence of the overcurrent due to the ground fault cannot be detected.

Figure 5:
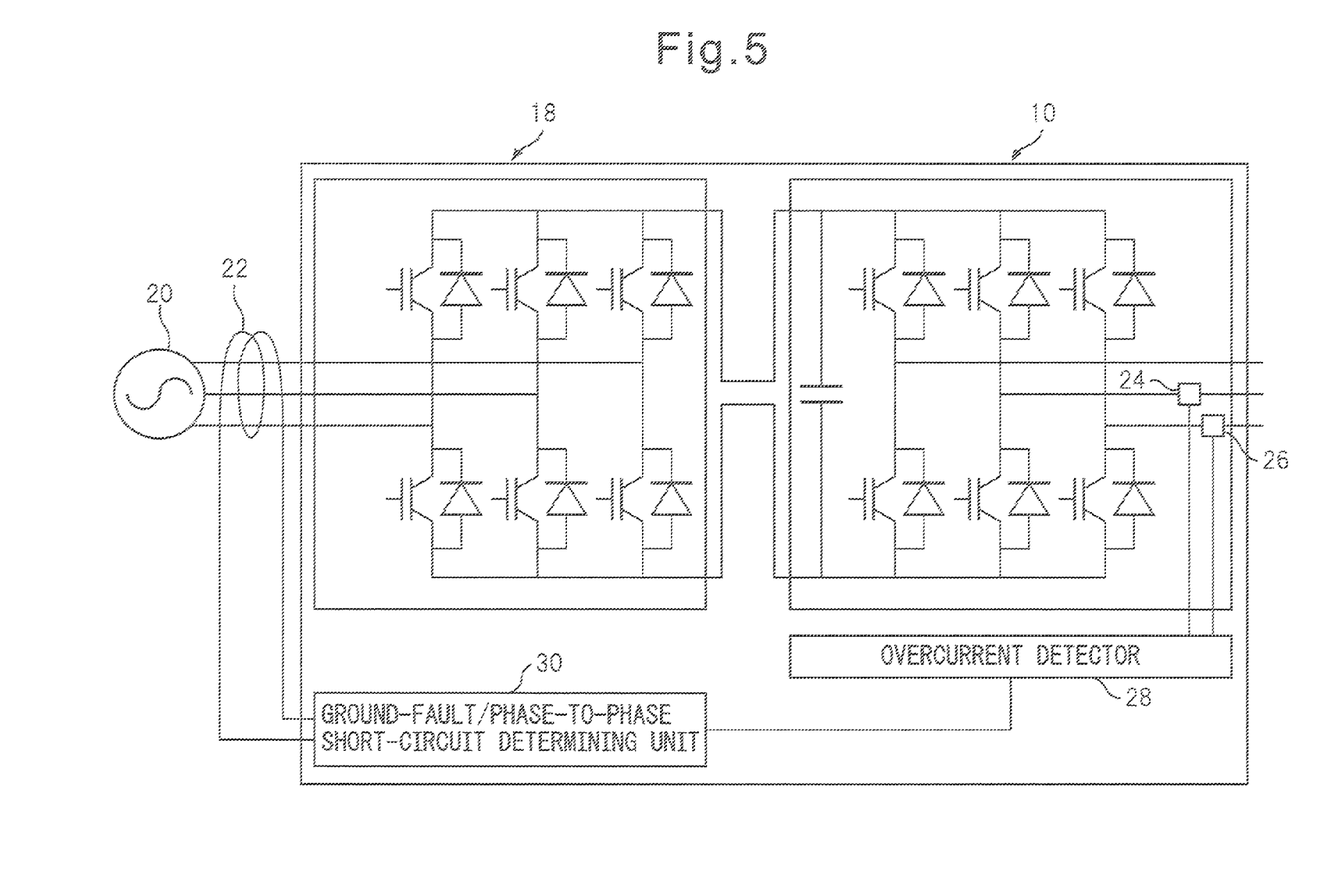
FIG. 5 is a diagram showing the configuration of a motor driving apparatus according to one embodiment of the present invention.

FIG. 5 shows the configuration of a motor driving apparatus, according to a first embodiment of the present invention, that has a function to detect the occurrence of overcurrent and to determine whether the cause is a phase-to-phase short circuit or a ground fault. An AC/DC converter 18 converts three-phase AC power supplied from a three-phase AC power supply 20 into DC power for output. A DC/AC converter 10 converts the DC power output from the AC/DC converter 18 into frequency variable three-phase AC power for output. Portions for controlling the transistors in the DC/AC converter 10 and AC/DC converter 18 are not shown here.

A zero phase current detector 22 detects the sum of the three-phase AC currents supplied from the three-phase AC power supply to the AC/DC converter 18. Current sensors 24 and 26 detect two of the three-phase AC currents output from the DC/AC converter 10. An overcurrent detector 28 detects overcurrent based on the currents detected by the current sensors 24 and 26. When overcurrent is detected by the overcurrent detector 28, a ground-fault/short-circuit determining unit 30 determines, based on the current detected by the zero phase current detector 22, whether the cause of the overcurrent is a ground fault or a phase-to-phase short circuit.

When the overcurrent is caused by a phase-to-phase short circuit, since there is no current return via ground for the three phases at the input side of the AC/DC converter 18 as well as at the output side of the DC/AC converter 10 described earlier, the relationship similar to that defined by equation (1) holds and no current is detected by the zero phase current detector 22. On the other hand, when the overcurrent is caused by a ground fault, a ground fault current flows and this ground fault current is detected by the zero phase current detector 22. Accordingly, when the overcurrent is detected by the overcurrent detector 28, if the sum of the currents detected by the zero phase current detector 22 is so small as to be judged to be equal to zero, the ground-fault/phase-to-phase short-circuit determining unit 30 determines that the cause of the overcurrent is a phase-to-phase short circuit; on the other hand, if the sum of the currents is not so small as to be judged to be equal to zero, it is determined that the cause of the overcurrent is a ground fault.

In the example of FIG. 5, since overcurrent is detected on two of the three output phases of the DC/AC converter 10, if a ground fault occurs on the phase not provided with a current sensor, the overcurrent cannot be detected by the overcurrent detector 28. However, since the ground fault current is detected by the zero phase current detector 22, the ground-fault/phase-to-phase short-circuit determining unit 30 can detect the occurrence of the ground fault.

To detect the sum of the currents at the input side, use may be made, instead of the zero phase current detector 22, of a clamp-on sensor or the like that detects current by detecting the magnetic field around the current using a Hall element. That is, by passing all of the three power lines through the detection ring of the clamp-on sensor, the sum of the currents can be detected, as in the case of the zero phase current detector.

Figure 6:
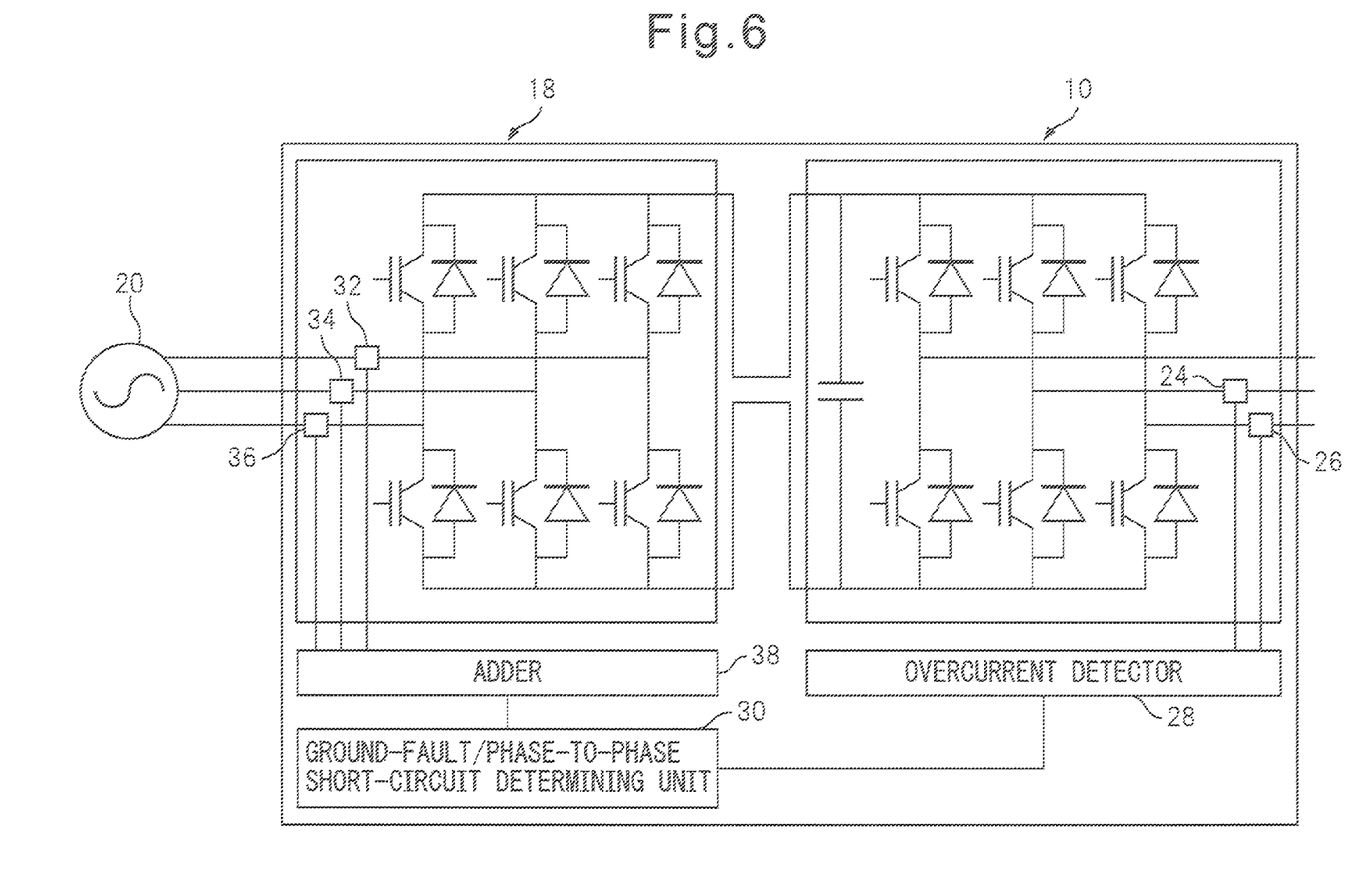
FIG. 6 is a diagram showing the configuration of a motor driving apparatus according to an alternative embodiment of the present invention.

FIG. 6 shows an example in which, instead of detecting the sum of the three-phase AC currents at the input side by the zero phase current detector 22, the three-phase AC currents at the input side are detected independently of each other by current sensors 32, 34, and 36 and are added together by an adder 38 to obtain the sum of the currents.

Figure 7:
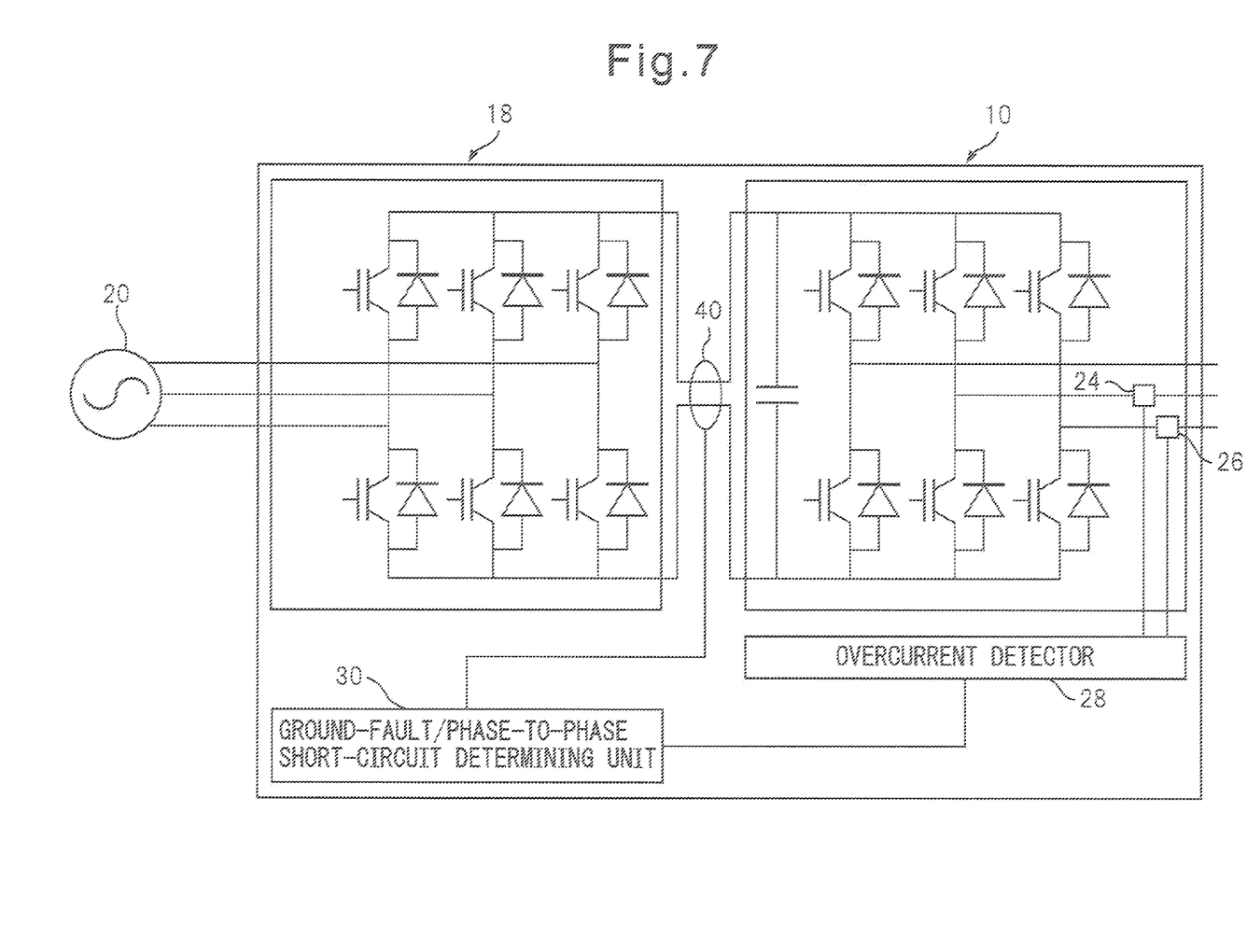
FIG. 7 is a diagram showing the configuration of a motor driving apparatus according to another alternative embodiment of the present invention.

FIG. 7 shows an example in which, as a means for detecting the sum of the currents at the input side, a clamp-on sensor 40 similar to the one described above is provided to detect the sum of the currents flowing on the two lines through which the DC power from the AC/DC converter 18 is supplied to the DC/AC converter 10.

Figure 8:
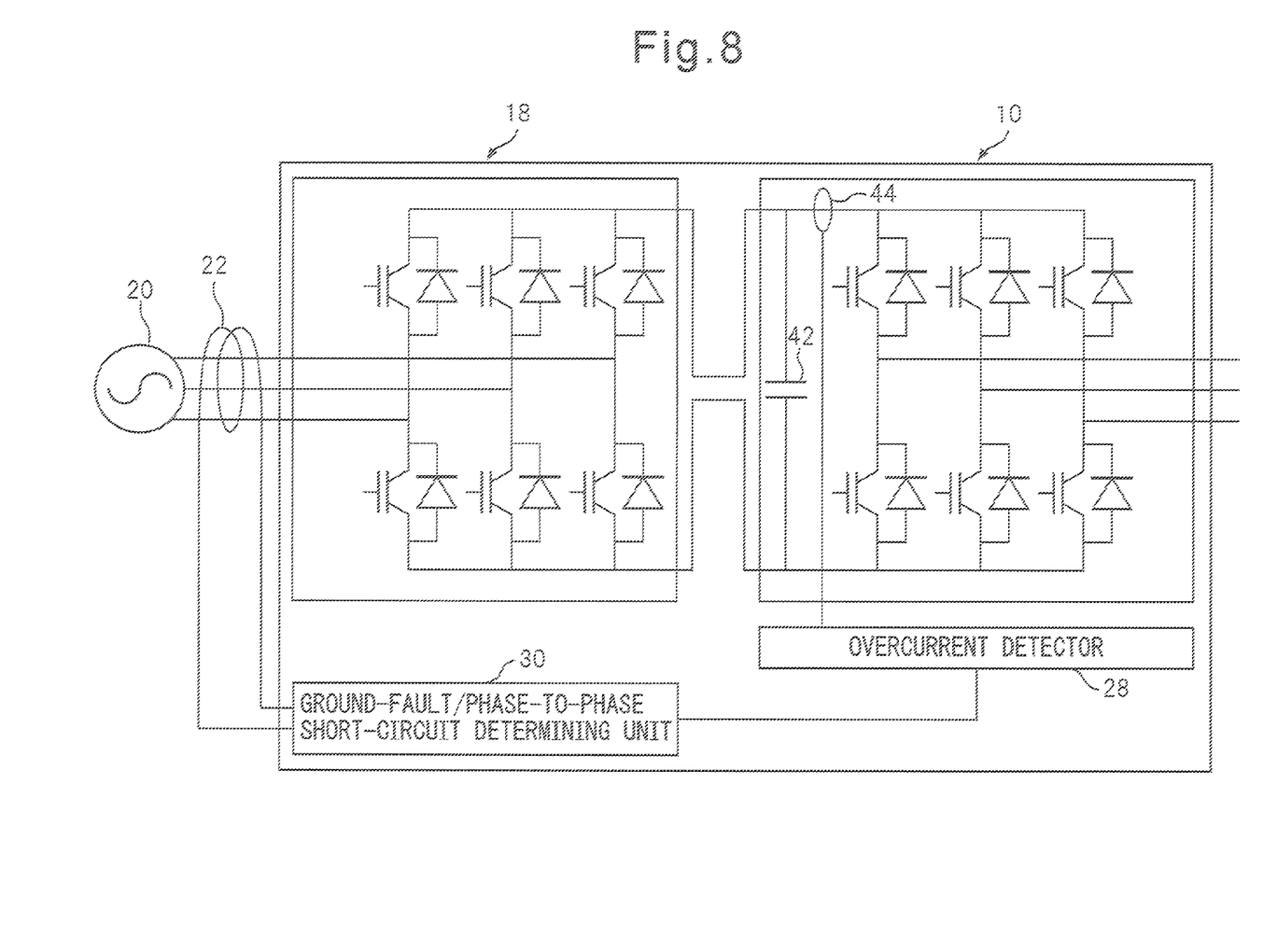
FIG. 8 is a diagram showing the configuration of a motor driving apparatus according to still another alternative embodiment of the present invention.

FIG. 8 shows an example in which the current sensors 24 and 26 shown in the example of FIG. 5 are omitted and, instead, a current sensor 44 is provided which detects overcurrent by detecting the current flowing on one of the two lines through which the DC power from the AC/DC converter 18 is supplied to the DC/AC converter 10 via a smoothing capacitor 42. As the means for detecting the sum of the currents, the means described with reference to FIG. 6 or 7 may be used instead of the current sensor 22 described with reference to FIG. 5.

Figure 9:
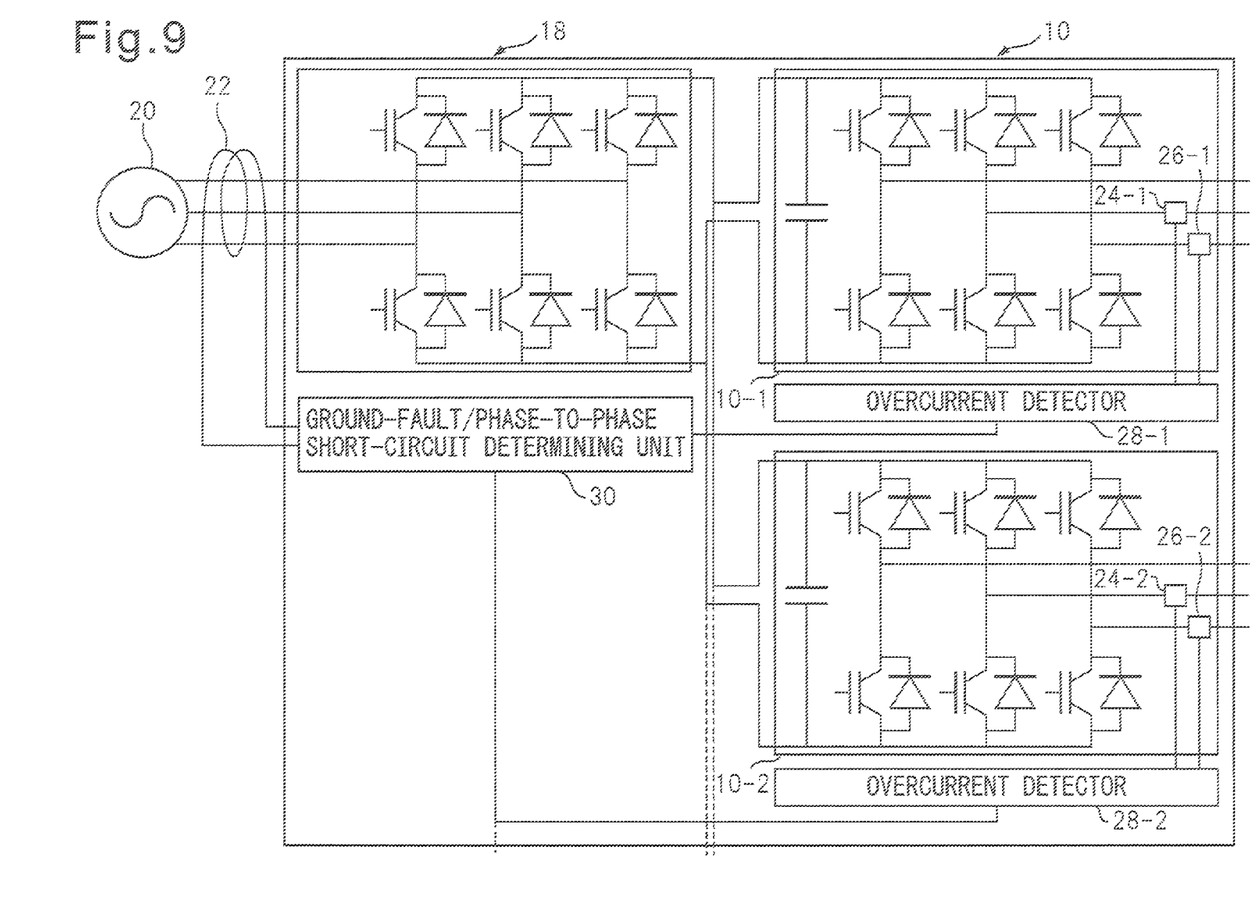
FIG. 9 is a diagram showing the configuration of a motor driving apparatus according to yet another alternative embodiment of the present invention.

FIG. 9 shows an example in which the DC/AC converter 10 is constructed from a plurality of inverters 10-1, 10-2, . . . in order to drive a plurality of motors. In this case, since the current sensor 22 and the ground-fault/phase-to-phase short-circuit determining unit 30 for making the ground-fault/phase-to-phase short circuit determination are provided on the AC/DC converter 18 side, the increase in cost is less than would be if an extra current sensor was added to each inverter.

The invention claimed is:

1. A motor driving apparatus, comprising:
    an AC/DC converter for converting three-phase AC power supplied from a three-phase AC power supply into DC power;
    a DC/AC converter for converting the DC power output from said AC/DC converter into three-phase AC power for supply to a motor;
    a sum current detector detecting a sum of currents flowing from said three-phase AC power supply through said AC/DC converter to said DC/AC converter;
    an overcurrent detector detecting overcurrent on an output current of said DC/AC converter; and
    a determining unit which, in response to a detection of overcurrent by said overcurrent detector,
        checks if the sum of currents detected by said sum current detector is judged to be zero or not,
        determines that a cause of the overcurrent is a ground fault if the sum of currents detected by said sum current detector is judged to be not zero,
        but determines that the cause of the overcurrent is a phase-to-phase short circuit if the sum of currents detected by said sum current detector is judged to be zero.

2. A motor driving apparatus according to claim 1, wherein said sum current detector includes a current sensor which detects the sum of the currents flowing on three lines through which said three-phase AC power from said three-phase AC power supply is supplied to said AC/DC converter.

3. A motor driving apparatus according to claim 1, wherein said sum current detector includes:
    three current sensors which detect the respective currents flowing on three lines through which said three-phase AC power from said three-phase AC power supply is supplied to said AC/DC converter; and
    summing means for calculating the sum of the currents detected by said three current sensors.

4. A motor driving apparatus according to claim 1, wherein said sum current detector includes a current sensor which detects the sum of the currents flowing on two lines through which said DC power from said AC/DC converter is supplied to said DC/AC converter.

5. A motor driving apparatus according to claim 1, wherein said overcurrent detector includes two current sensors which detect said overcurrent by detecting the respective currents flowing on two of three lines through which said three-phase AC power from said DC/AC converter is supplied to said motor.

6. A motor driving apparatus according to claim 1, wherein said overcurrent detector includes a current sensor which detects said overcurrent by detecting the current flowing on one of the two lines through which said DC power from said AC/DC converter is supplied to said DC/AC converter.

7. A motor driving apparatus according to claim 1, wherein said DC/AC converter includes a plurality of inverters which convert the DC power into the three-phase AC power for supply to a plurality of motors, respectively, and wherein
    said AC/DC converter supplies said DC power, converted from the three-phase AC power of the three-phase AC power supply, in parallel to said plurality of inverters.

* * * * *